(12) United States Patent
Overweg

(10) Patent No.: US 7,737,696 B2
(45) Date of Patent: Jun. 15, 2010

(54) MAGNETIC RESONANCE SCANNER WITH A LONGITUDINAL MAGNETIC FIELD GRADIENT SYSTEM

(75) Inventor: Johannes Overweg, Uelzen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 48 days.

(21) Appl. No.: 12/097,556

(22) PCT Filed: Dec. 12, 2006

(86) PCT No.: PCT/US2006/061914

§ 371 (c)(1),
(2), (4) Date: Jun. 16, 2008

(87) PCT Pub. No.: WO2007/076252

PCT Pub. Date: Jul. 5, 2007

(65) Prior Publication Data

US 2008/0303523 A1      Dec. 11, 2008

Related U.S. Application Data

(60) Provisional application No. 60/752,121, filed on Dec. 20, 2005.

(51) Int. Cl.
*G01V 3/00* (2006.01)
(52) U.S. Cl. .................................................... 324/319
(58) Field of Classification Search ......... 324/300–322; 600/410–435
See application file for complete search history.

(56) References Cited

U.S. PATENT DOCUMENTS

| | | | |
|---|---|---|---|
| 4,644,281 A | 2/1987 | Savelainen | |
| 4,848,103 A | 7/1989 | Pelc et al. | |
| 4,878,023 A | 10/1989 | Overweg et al. | |
| 5,168,231 A * | 12/1992 | Aubert | 324/320 |
| 5,280,247 A * | 1/1994 | DeMeester et al. | 324/318 |
| 5,289,128 A * | 2/1994 | DeMeester et al. | 324/318 |
| 5,296,810 A * | 3/1994 | Morich | 324/318 |
| 5,525,904 A * | 6/1996 | Hanley et al. | 324/300 |
| 5,539,367 A | 7/1996 | Xu et al. | |
| 5,545,996 A | 8/1996 | Morich et al. | |
| 5,633,588 A * | 5/1997 | Hommei et al. | 324/320 |
| 5,799,653 A * | 9/1998 | Carlson | 600/410 |
| 6,140,900 A * | 10/2000 | Crozier et al. | 335/299 |
| 6,157,276 A * | 12/2000 | Hedeen et al. | 335/216 |
| 6,326,788 B1 | 12/2001 | Mulder et al. | |

(Continued)

FOREIGN PATENT DOCUMENTS

GB       2301674 A      12/1996

*Primary Examiner*—Brij B Shrivastav
*Assistant Examiner*—Dixomara Vargas

(57) ABSTRACT

In a magnetic resonance scanner, a main magnet system (10) is wound to generate a longitudinally directed main magnetic field ($B_0$) at least in a scanning region (20). The main magnet system includes a central magnet winding region (30) wound layer-by-layer disposed between outer magnet winding regions (32, 34). A longitudinal magnetic field gradient system (12, 12') includes a central gradient winding region (40, 40', 42, 42') wound to generate a main longitudinally directed magnetic field gradient disposed between outer gradient winding regions (44, 46) wound to generate a compensatory longitudinally directed magnetic field gradient having opposite polarity from the main longitudinally directed magnetic field gradient. The outer gradient winding regions are arranged to substantially null mutual inductance between the outer magnet winding regions (32, 34) and the longitudinal magnetic field gradient system (12, 12').

15 Claims, 7 Drawing Sheets

U.S. PATENT DOCUMENTS

| | | |
|---|---|---|
| 6,362,623 B1 | 3/2002 | Goto |
| 6,700,468 B2 * | 3/2004 | Crozier et al. ............... 335/299 |
| 6,741,078 B2 | 5/2004 | Overweg |
| 6,822,451 B2 | 11/2004 | Hollis |
| 6,856,223 B1 * | 2/2005 | Takeshima et al. .......... 335/301 |
| 6,937,019 B2 * | 8/2005 | Okada et al. ................. 324/321 |
| 6,975,118 B2 * | 12/2005 | Okada et al. ................. 324/321 |
| 7,019,609 B2 * | 3/2006 | Huang et al. ................. 335/296 |
| 7,319,329 B2 * | 1/2008 | Huang et al. ................. 324/319 |
| 7,417,434 B2 * | 8/2008 | Overweg .................... 324/318 |
| 7,501,819 B2 * | 3/2009 | Ong ........................... 324/306 |

* cited by examiner

MAGNETIC RESONANCE SCANNER WITH A LONGITUDINAL MAGNETIC FIELD GRADIENT SYSTEM

CROSS REFERENCE TO RELATED APPLICATIONS

This application claims the benefit of U.S. provisional application ser. no. 60/752,121 filed Dec. 20, 2005, which is incorporated herein by reference.

DESCRIPTION

The following relates to the magnetic resonance arts. It finds particular application in magnetic resonance imaging, and will be described with particular reference thereto. However, it also finds more general application in magnetic resonance imaging, magnetic resonance mapping, magnetic resonance spectroscopy, and the like.

In order to reduce volume and cost of a magnetic resonance scanner, it is advantageous to place the windings of the gradient coils close to the windings of the main magnet, usually at a slightly smaller radius compared with the main magnet windings. However, such an arrangement makes it difficult to include shielding for the gradient coils.

Without shielding, it is typically found that substantial electromagnetic coupling exists is between the longitudinal or z-gradient coil and the main magnet of a bore-type scanner. The present inventor, for example, has estimated that switching externally generated longitudinal magnetic field gradients can induce voltages of 10,000 volts or more in the main magnet windings.

These induced voltages stress the electrical insulation of the main magnet circuitry. Additionally, dielectric currents caused by the induced voltages can lead to eddy current-like field errors. Still further, the induced voltages complicate the design of quench detection and protection circuitry of the main magnet.

According to one aspect, a magnetic resonance scanner is disclosed. A main magnet system is wound to generate a longitudinally directed main magnetic field at least in a scanning region. The main magnet system includes a central magnet winding region wound layer-by-layer disposed between outer magnet winding regions. A longitudinal magnetic field gradient system includes a central gradient winding region wound to generate a main longitudinally directed magnetic field gradient disposed between outer gradient winding regions wound to generate a compensatory longitudinally directed magnetic field gradient having opposite polarity from the main longitudinally directed magnetic field gradient. The outer gradient winding regions are arranged to substantially null mutual inductance between the outer magnet winding regions and the longitudinal magnetic field gradient system.

According to another aspect, a main magnet system is disclosed for generating a longitudinally directed main magnetic field at least in a scanning region of a magnetic resonance scanner. A magnet winding region is disposed at a central scanner plane. The magnet winding region is wound layer-by-layer.

According to another aspect, a longitudinal magnetic field gradient system is disclosed, which is wound to generate a longitudinally directed magnetic field gradient at least in a scanning region of a magnetic resonance scanner. A central gradient winding region is arranged symmetrically about a central scanner plane and is wound to generate a main longitudinally directed magnetic field. Outer gradient winding regions are arranged symmetrically on opposite sides of the central scanner plane and surround the central gradient winding region. The outer gradient winding regions are wound to generate a compensatory longitudinally directed magnetic field gradient having opposite polarity from the main longitudinally directed magnetic field gradient. The outer gradient winding regions are arranged to substantially null mutual inductance between outer windings of a main magnet system of the magnetic resonance scanner and the longitudinal magnetic field gradient system.

One advantage resides in reduced electromagnetic coupling between main magnet windings and gradient coil windings arranged close to the main magnet windings.

Another advantage resides in reduced stress on the insulation of the main magnet.

Another advantage resides in simplified design of the main magnet and related quenching and protection circuitry.

Another advantage resides in enabling a larger bore opening diameter and/or a smaller magnet diameter.

Another advantage resides in reduced scanner manufacturing cost.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

Figure 1:
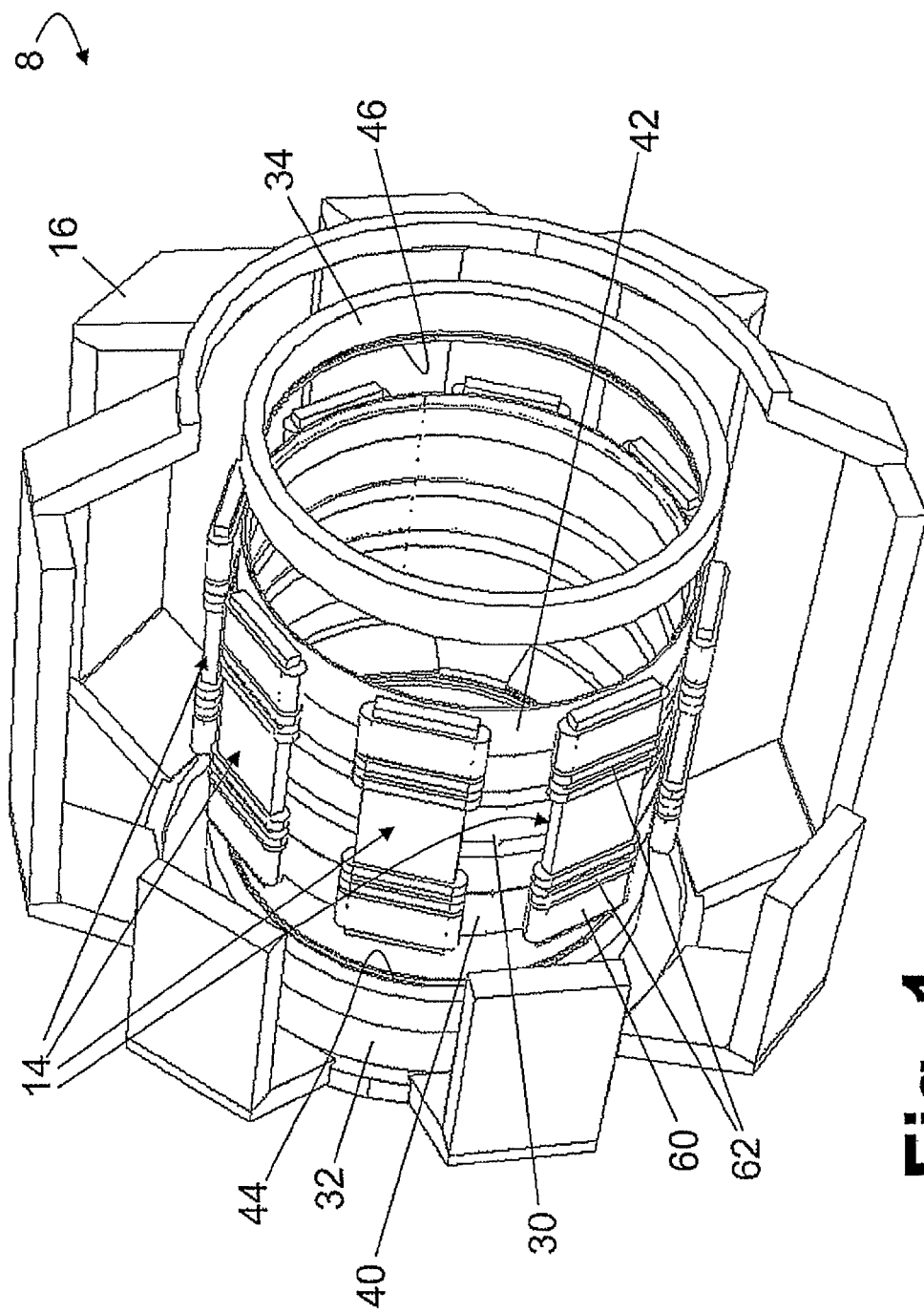
FIG. 1 shows a diagrammatic perspective view of an example magnetic resonance scanner including the main magnet and magnetic field gradient systems. A ferromagnetic flux return yoke of the scanner is partially cut away to reveal internal scanner components.
Figure 2:
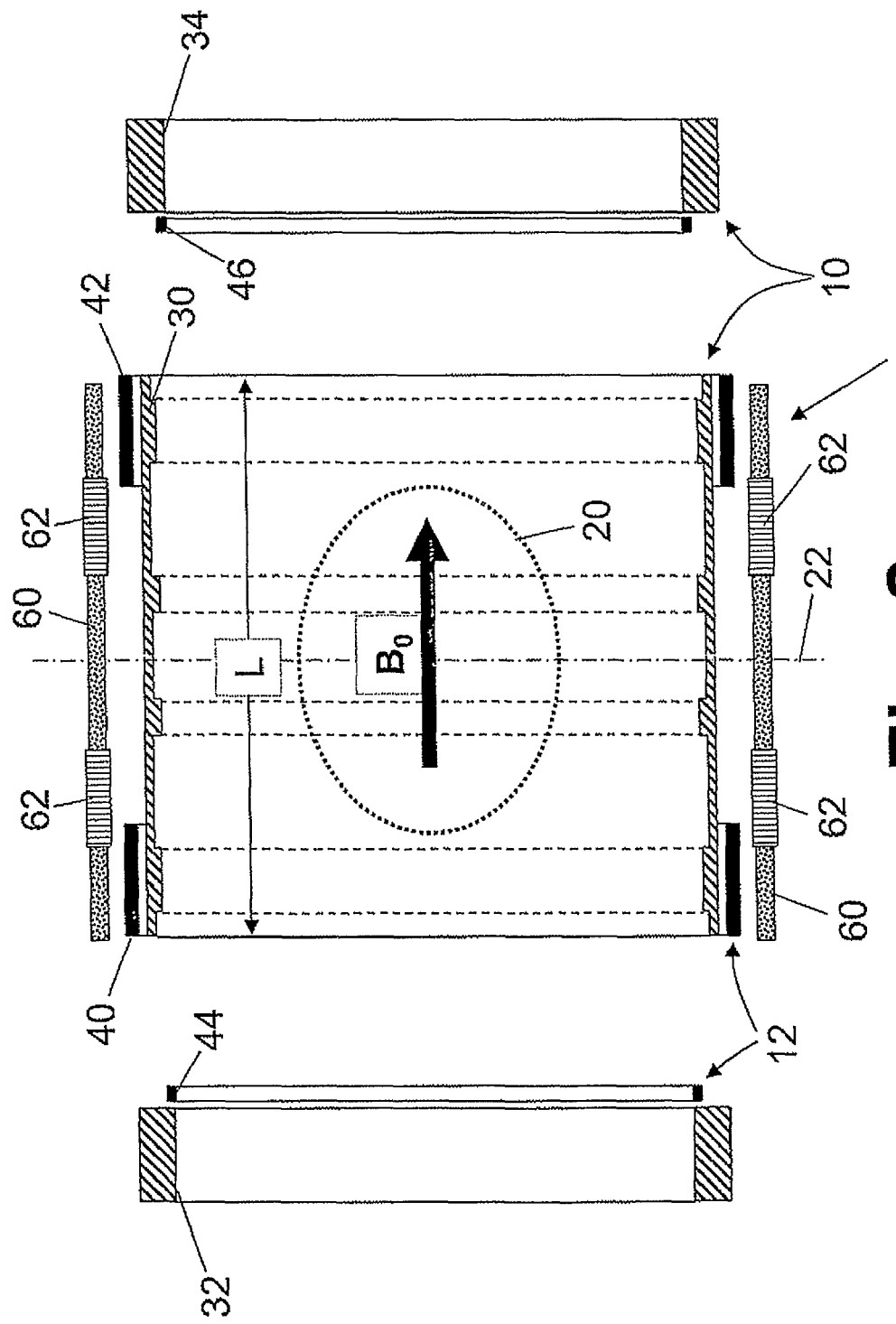
FIG. 2 shows a diagrammatic sectional view of the example magnetic resonance scanner of FIG. 1, with the ferromagnetic flux return yoke omitted and the scanning region and a central scanner plane indicated.
Figure 3:
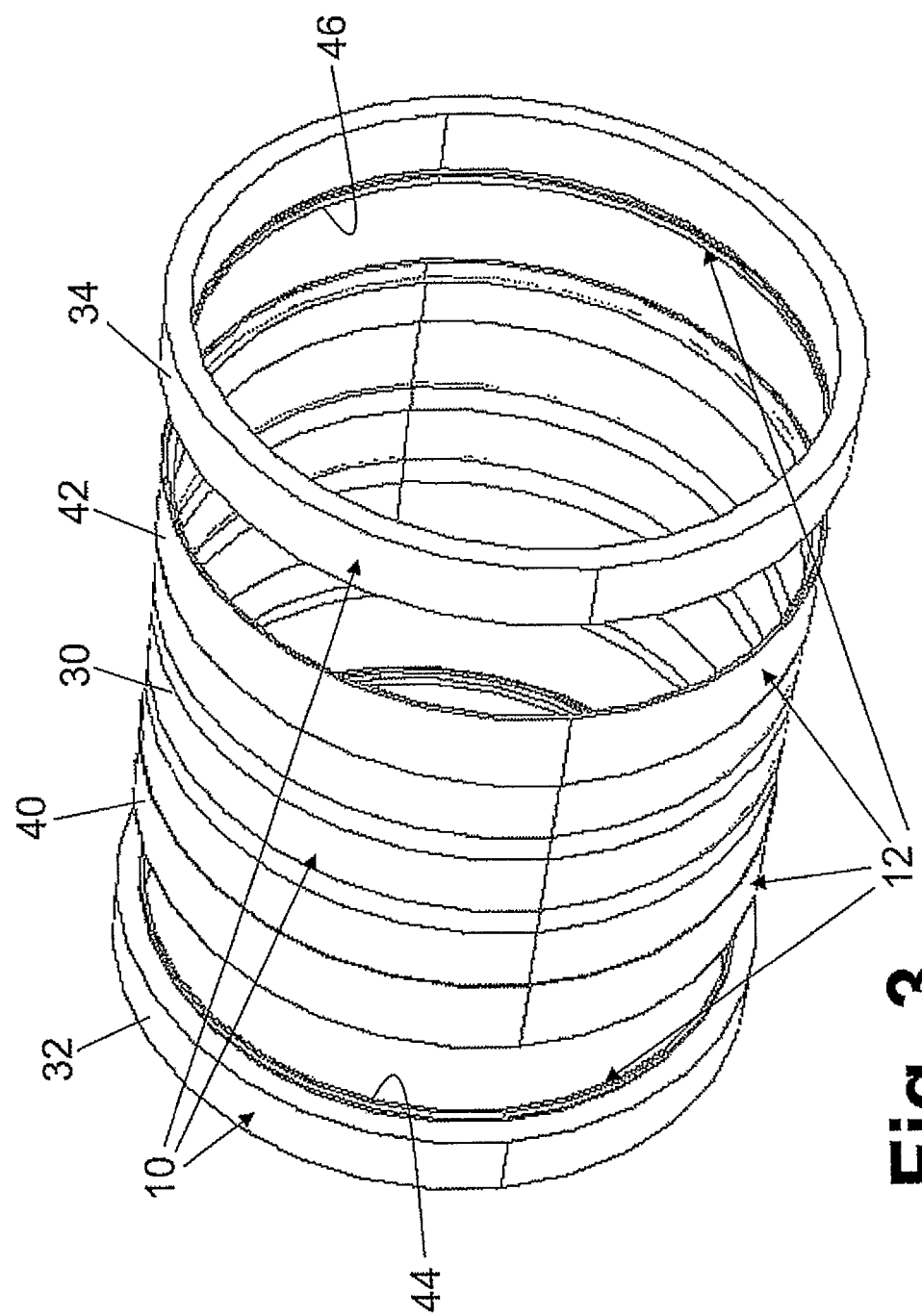
FIG. 3 shows a diagrammatic perspective view of the main magnet and longitudinal magnetic field gradient systems of the example magnetic resonance scanner of FIG. 1.
Figure 4:
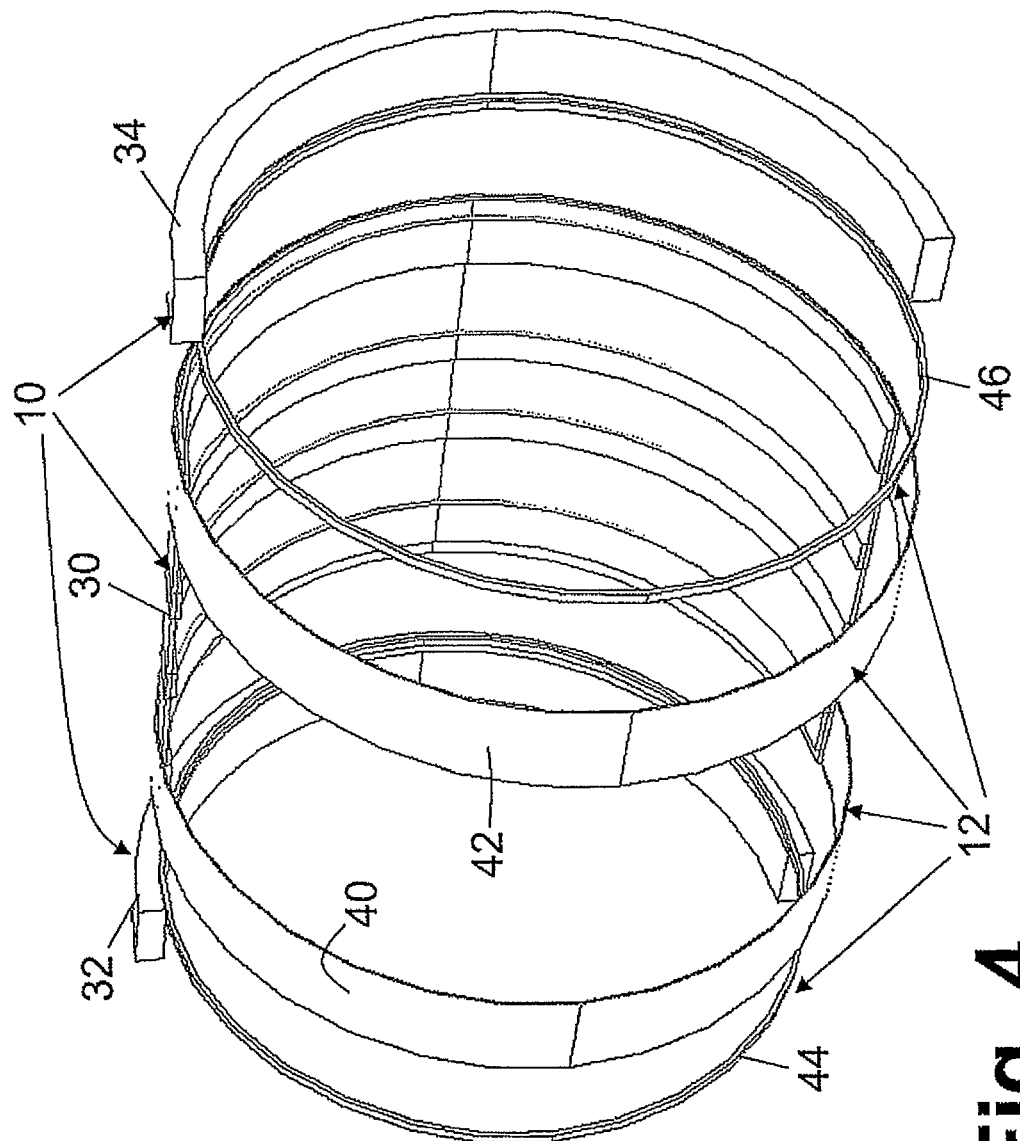
FIG. 4 shows a diagrammatic perspective view of the main magnet and longitudinal magnetic field gradient systems of FIG. 3, but with a one-half circumference of the main magnetic field coils removed.
Figure 7:
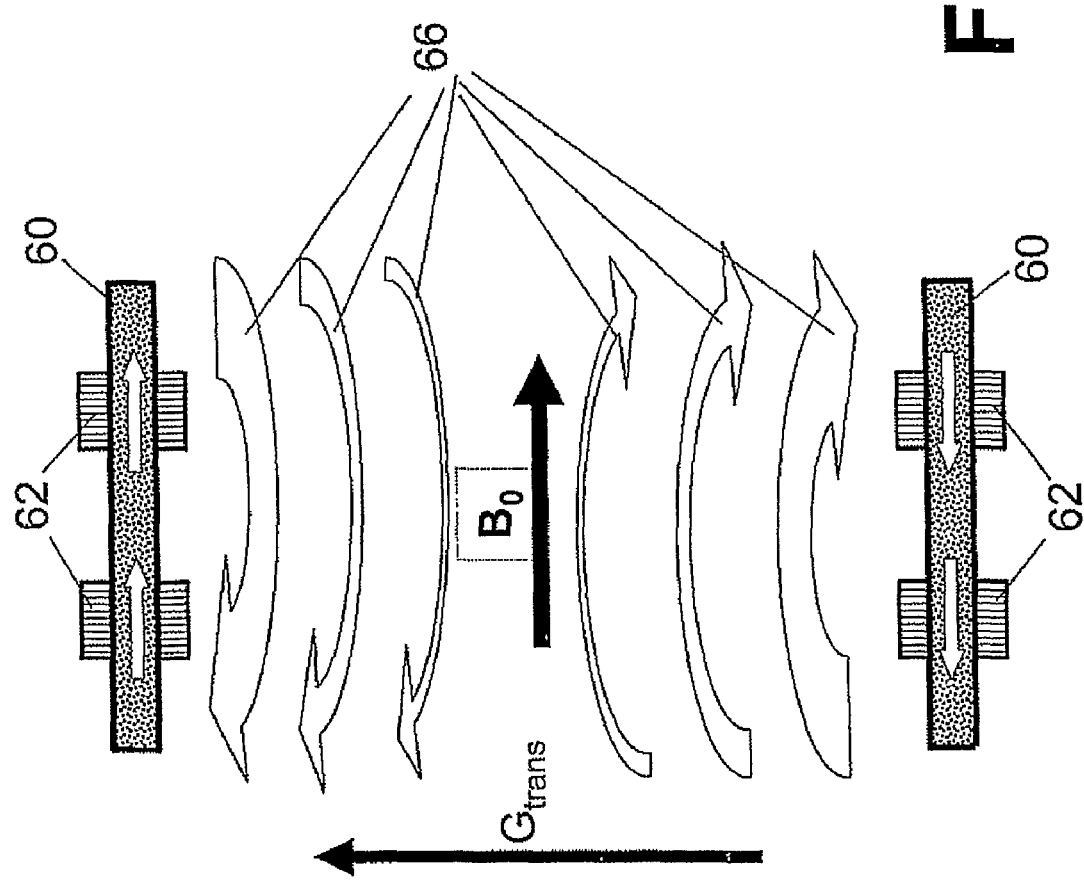

FIG. 7 diagrammatically illustrates generation of a transverse magnetic field gradient using the transverse magnetic field gradient system of FIGS. 1 and 2.

With reference to FIGS. 1-5, a magnetic resonance scanner 8 suitable for performing magnetic resonance imaging, magnetic resonance spectroscopy, or so forth includes a main magnet system 10 (system labeled in FIGS. 2-5), a longitudinal magnetic field gradient system 12 (system labeled in FIGS. 2-5), a transverse magnetic field gradient system 14 (system labeled in FIGS. 1-2), and a ferromagnetic flux return yoke 16 (shown in FIG. 1, with a portion of the yoke 16 cut away to reveal internal scanner components).

The main magnet system 10 is wound to generate a longitudinally directed main magnetic field $B_0$ (diagrammatically indicated in FIGS. 2 and 5) at least in a scanning region 20. The main magnet system 10 is longitudinally symmetric about a central scanner plane 22. The main magnet system 10 includes a central magnet winding region 30 wound layer-by-layer disposed between outer magnet winding regions 32, 34. The outer magnet winding regions 32, 34 are arranged symmetrically about the central scanner plane 22. The central magnet winding region is disposed symmetrically to the central scanner plane 22 between the outer magnet winding regions 32, 34. In the illustrated embodiment, the windings of each layer of the central magnet winding region 30 continuously span a longitudinal length L (indicated in FIG. 2) of the central magnet winding region 30, and a longitudinal winding density of the layers is varied to produce the longitudinally directed static main magnetic field $B_0$ which is substantially uniform within the scanning region 20. In other contemplated embodiments (not illustrated), the windings of each layer of the central magnet winding region may be grouped into a plurality of spaced-apart winding groups collectively spanning the longitudinal length L of the central magnet winding region and arranged to produce the longitudinally directed main magnetic field $B_0$ substantially uniform within a scanning region.

The longitudinal magnetic field gradient system 12 is wound to generate a longitudinally directed magnetic field gradient at least in the scanning region 20. The longitudinal magnetic field gradient system 12 includes a central gradient winding region which in the illustrated embodiment includes two spaced-apart winding sections 40, 42 symmetrically disposed about the central scanner plane 22. The central gradient winding region 40, 42 is wound to generate the main longitudinally directed magnetic field gradient. For example, in some embodiments the winding sections 40, 42 are suitably connected in series but wound in opposite directions, forming a configuration similar to an anti-Helmholtz coil pair in which the longitudinally directed component of the magnetic field generated by one of the winding sections 40, 42 aligns with and strengthens the longitudinally directed main magnetic field $B_0$ while the longitudinally directed component of the magnetic field generated by the other of the winding sections 40, 42 opposes and weakens the longitudinally directed main magnetic field $B_0$.

Additionally, the longitudinal magnetic field gradient system 12 includes outer gradient winding regions 44, 46 arranged symmetrically on opposite sides of the central scanner plane 22 and surrounding the central gradient winding region 40, 42. In other words, the central gradient winding region 40, 42 is disposed between the outer gradient winding regions 44, 46. The outer gradient winding regions 44, 46 are wound to generate a compensatory longitudinally directed magnetic field gradient having opposite polarity from the main longitudinally directed magnetic field gradient generated by the central gradient winding region 40, 42. For example, in some embodiments the outer gradient winding sections 44, 46 are suitably connected in series but wound in opposite directions to form a configuration similar to an anti-Helmholtz coil pair having opposite polarity from the configuration of the central gradient winding region 40, 42.

The compensatory longitudinally directed magnetic field gradient is substantially weaker than the main longitudinally directed magnetic field gradient, so that the polarity of the longitudinally directed magnetic field gradient produced by the longitudinal magnetic field gradient system 12 corresponds to the polarity of the main longitudinally directed, magnetic field gradient. However, as will be discussed, the compensatory longitudinally directed magnetic field gradient has the advantageous effect of reducing mutual coupling between the outer magnet winding regions 32, 34 and the longitudinal magnetic field gradient system 12.

The disclosed main magnet system 10 and longitudinal magnetic field gradient system 12 are advantageously configured to substantially reduce voltages induced in the main magnet system 10 by switching of the longitudinal magnetic field gradient system 12. In one aspect, a layer-by-layer winding is used for the central magnet winding region 30. That is, a single layer of winding spanning the longitudinal length L is laid down, followed by a second layer of winding spanning the longitudinal length L, followed by a third layer of winding spanning the longitudinal length L, and so forth. The layer-by-layer winding configuration causes the voltage induced by gradient switching to be close to zero.

It will be appreciated that, regardless of the winding configuration, the net voltage induced in the main magnet windings by the longitudinal magnetic field gradient will generally be zero due to the difference in symmetry between the magnet coils (having a Helmholtz pair-type symmetry) and the longitudinal gradient coils (having an anti-Helmholtz pair-type symmetry). However, when the magnet windings are not layer-by-layer, high induced voltages can build up in portions of main magnet windings responsive to longitudinal magnetic field gradient switching. These high induced voltages can have deleterious effects on insulation integrity and can produce electromagnetic distortions or artifacts in the magnetic resonance scanning data. By winding the central magnet winding region 30 layer-by-layer, with at least the outer layers extending between the gradient windings 40, 42, the induced voltages cancel on a layer-by-layer basis, so that substantial induced voltages do not build up in any portion of the central magnet windings 30.

The layer-by-layer winding approach suitably avoids high induced voltages, and in some contemplated embodiments the entire main magnet system including the central magnet windings and the outer magnet winding regions 32, 34 is wound layer-by-layer. This approach entails winding a first layer by laying down windings for the outer magnet winding region 32, the central magnet winding region 30, and the outer magnet winding region 34, followed by a return series connection wire segment going back to the outer magnet winding region 32 to start winding of the second layer, and so forth. In embodiments in which the entire main magnet is wound layer-by-layer, the outer gradient winding regions 44, 46 that are wound to generate the compensatory longitudinally directed magnetic field gradient are optionally omitted.

However, such a completely layer-by-layer winding configuration complicates manufacturing, and introduces a large number of lengthy series wire segment connections between the magnet winding regions 30, 32, 34.

Accordingly, in the illustrated embodiment only the central magnet winding region 30 is wound layer-by-layer. The outer magnet winding regions 32, 34 are not wound layer-by-layer. Rather, in one embodiment the entire outer magnet winding region 32 is wound as a unit, the entire outer magnet winding region 34 is wound as a unit, and two series wire segment connections connect the outer magnet winding region 32, the central layer-by-layer wound magnet section 30, and the outer magnet winding region 34 in series. In other embodiments, the outer magnet winding regions 32, 34 may be wound in two, three, four units, or more units. In another embodiment, outer layers are wound in common and inner layers of the end sections 32, 34 are wound separately from the inner section 30.

To avoid high induced voltages in the outer magnet winding regions 32, 34 which are not wound layer-by-layer, the outer gradient winding regions 44, 46 are arranged so as to substantially null mutual inductance between outer magnet winding regions 32, 34 and the longitudinal magnetic field gradient system 12. In one approach, substantial mutual inductance nulling is achieved by positioning the outer gradient winding sections 44, 46 at about the same radius as the main magnet system 10 (for example, by having the windings of the gradient winding sections 44, 46 within about ±5% of the radius of the windings of the main magnet system 10) and with a longitudinal separation between the outer gradient winding regions 44, 46 being smaller than a longitudinal separation between the outer magnet winding regions 32, 34 (that is, with the outer gradient winding regions 44, 46 being "inside of" the outer magnet winding regions 32, 34). In this arrangement the opposite polarity compensatory longitudinal magnetic field gradient produced by the outer gradient winding regions 44, 46 strongly influences the nearby outer magnet winding regions 32, 34 so as to null the mutual inductance.

Figure 5:
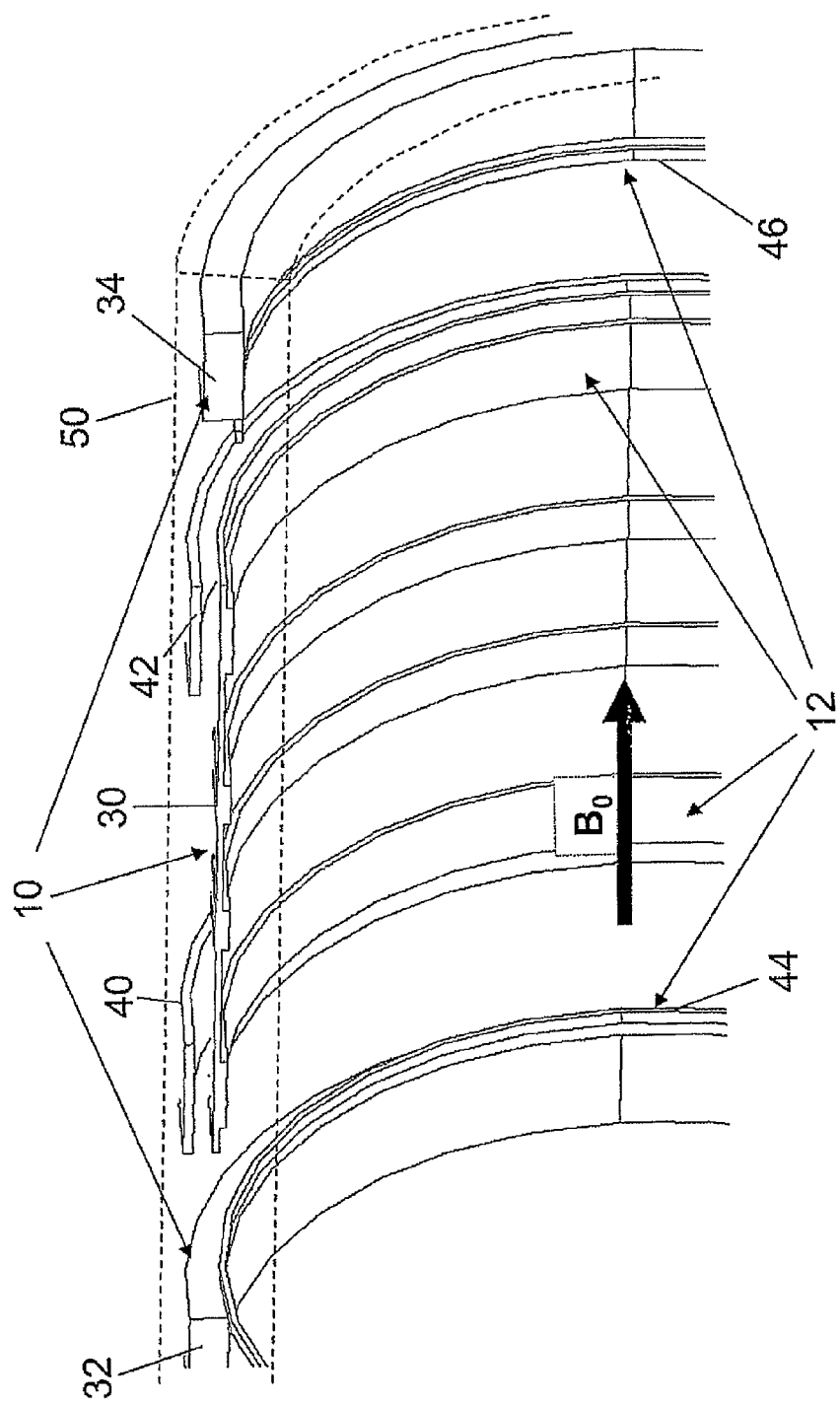
FIG. 5 shows a diagrammatic perspective view of a 90° arc of the main magnet and longitudinal magnetic field gradient systems of FIG. 3. A vacuum jacket containing the central and outer magnet winding regions is diagrammatically indicated in phantom.

With reference to FIG. 5, in some embodiments the main magnet system 10 is contained in a vacuum jacket 50 (shown diagrammatically in phantom in FIG. 5) to facilitate cooling or refrigeration of the main magnet system 10. In some embodiments, the windings of the main magnet system 10 are made of a high-temperature superconducting material, such as yttrium-barium-copper-oxide (YBCO) or bismuth-based BSCCO. Such high-temperature superconducting conductors typically can operate to carry suitably large superconducting electrical currents at temperatures of around 30K to 70K. Accordingly, the vacuum jacket 50 and its contents are cooled or refrigerated by thermal conduction, flow of a cryogenic fluid such as liquid nitrogen or liquid helium, or so forth. In the illustrated embodiment, the windings of the longitudinal magnetic field gradient system 12 are also made of a high-temperature superconducting material, and the central and outer gradient winding regions 40, 42, 44, 46 are also contained in the vacuum jacket 50.

Figure 6:
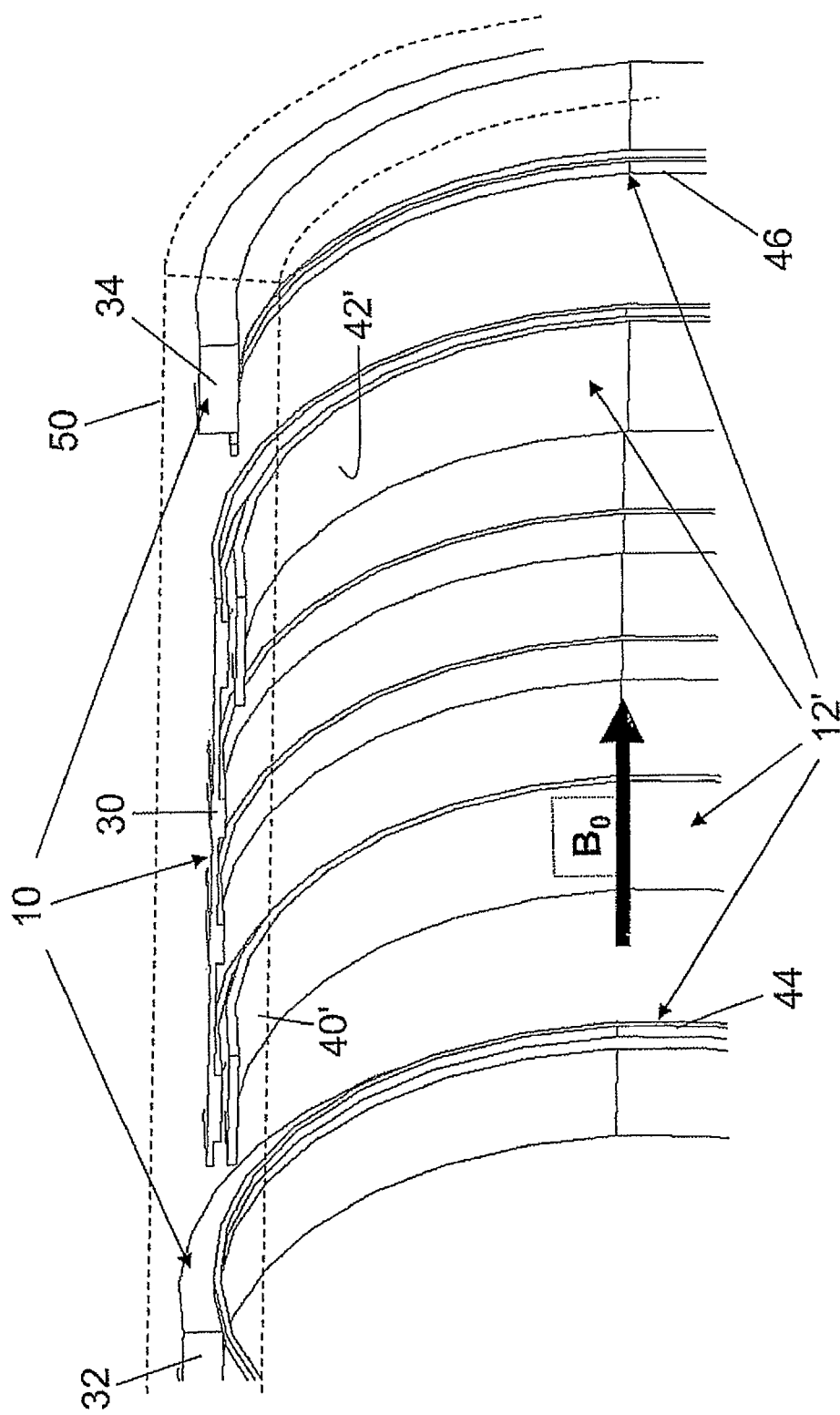
FIG. 6 shows a diagrammatic perspective view of a 90° arc of main magnet and longitudinal magnetic field gradient systems similar to those of FIGS. 1-5, but in which the central gradient winding regions of the longitudinal magnetic field gradient system are disposed at a smaller radius than the main magnet windings.

In the embodiment of FIGS. 1-5, the central gradient winding region 40, 42 surrounds the central magnet winding region 30. In other words, the central gradient winding region 40, 42 is at a larger radius than the main magnet system 10. Alternatively, as shown in FIG. 6, a longitudinal magnetic field gradient system 12' has central gradient winding region 40', 42' that are surrounded by the central magnet winding region 30. In other words, in the embodiment of FIG. 6 the central gradient winding region 40', 42' is at a smaller radius than the main magnet system 10.

With returning reference to FIGS. 1 and 2 and with further reference to FIG. 7, the illustrated transverse magnetic field gradient system 14 includes a plurality of ferromagnetic crossbars 60 each magnetically driven by windings 62 to define a bar-type electromagnet. In the example of FIG. 7, the top ferromagnetic crossbar 60 is driven with a current producing a magnetic flux directed toward the right; whereas, the bottom ferromagnetic crossbar 60 is driven with a current producing a magnetic flux directed toward the left. Leakage magnetic flux 66 (diagrammatically indicated by arrows in FIG. 7) produces the indicated transverse magnetic field gradient $G_{trans}$ superimposed on the main magnetic field $B_0$. While FIG. 7 illustrates operation using two opposing ferromagnetic crossbars 60, it will be appreciated that improved uniformity of the transverse magnetic field gradient can be achieved by employing additional ferromagnetic crossbars 60. For example, FIG. 1 depicts the transverse magnetic field gradient system 14 as including eight ferromagnetic crossbars 60, which can be used together to produce a substantially uniform transverse magnetic field gradient over the scanning region 20.

The illustrated transverse magnetic field gradient system 14 is disposed outside of the main magnet system 10. That is, the illustrated transverse magnetic field gradient system 14 is disposed at a larger radius than the main magnet system 10. Although not illustrated, it is contemplated for the ferromagnetic bars 60 and windings 62 of the transverse magnetic field gradient system 14 to be contained inside the vacuum jacket 50, for example if the windings 62 are made of superconducting conductors.

In other embodiments, a transverse magnetic field gradient system employing conventional "fingerprint whorl" coil pairs can be used. Such a conventional transverse magnetic field gradient system is typically disposed inside of the main magnet system 10, that is, at a radius smaller than the radius of the main magnet system 10. If the fingerprint whorl coil pairs are superconducting, it is contemplated to dispose them inside of the vacuum jacket 50.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the perferred embodiments, the invention is now claimed to be:

1. A main magnet system for generating a longitudinally directed main magnetic field at least in a scanning region of a magnetic resonance scanner, the main magnet system comprising:
    a central magnet winding region disposed at a central scanner plane, the central magnet winding region being wound layer by layer wherein a single layer of winding spanning the longitudinal length of the central magnet winding region is laid down, followed by a second layer of winding spanning the longitudinal length of the central magnet winding region, followed by a third layer of winding spanning the longitudinal length of the central magnet winding region, and so forth.

2. A magnetic resonance scanner comprising:
    a main magnet system according to claim 1; and
    a longitudinal magnetic field gradient system including a central gradient winding region wound to generate a main longitudinally directed magnetic field gradient.

3. The magnetic resonance scanner as set forth in claim 2, wherein the windings of each layer of the central magnet winding region continuously span a longitudinal length of the central magnet winding region, a longitudinal winding density of the layers being varied to produce the longitudinally directed main magnetic field substantially uniform at least within the scanning region.

4. The magnetic resonance scanner as set forth in claim 2, wherein the main magnet system further includes:
    outer magnet winding regions arranged outside of the central magnet winding region and symmetrically about a central scanner plane.

5. A magnetic resonance imaging system comprising:
    a main magnet system according to claim 1.

6. A magnetic resonance scanner comprising:
    a main magnet system for generating a longitudinally directed main magnetic field at least in a scanning region of a magnetic resonance scanner, the main magnet system including a central magnet winding region disposed at a central scanner plane, the central magnet winding region being wound layer by layer, wherein the central gradient winding region includes a plurality of spaced apart winding sections symmetrically disposed about the central scanner plane and at least layers of the central magnet winding region closest to the spaced apart winding sections each include sheets of length commensurate with the spacing between the spaced apart winding sections wound circumferentially around the scanning region; and a longitudinal magnetic field gradient system including a central gradient winding region wound to generate a main longitudinally directed magnetic field gradient.

7. A magnetic resonance scanner comprising:

a main magnet system for generating a longitudinally directed main magnetic field at least in a scanning region of a magnetic resonance scanner, the main magnet system including a central magnet winding region disposed at a central scanner plane, the central magnet winding region being wound layer by layer, and outer magnet winding regions arranged outside of the magnet winding region and symmetrically about a central scanner plane; and a longitudinal magnetic field gradient system including a central gradient winding region wound to generate a main longitudinally directed magnetic field gradient and outer gradient winding regions, the central gradient winding region being disposed between the outer gradient winding regions, the outer gradient winding regions generating a compensatory longitudinally directed magnetic field gradient having opposite polarity from the main longitudinally directed magnetic field gradient to substantially null mutual inductance between the outer magnet winding regions and the longitudinal magnetic field gradient system.

8. The magnetic resonance scanner as set forth in claim 7, wherein the main magnet system is symmetric about the central scanner plane and the longitudinal magnetic field gradient system is symmetric about the central scanner plane.

9. The magnetic resonance scanner as set forth in claim 8, wherein a longitudinal separation between the outer gradient winding regions is smaller than a longitudinal separation between the outer magnet winding regions.

10. The magnetic resonance scanner as set forth in claim 7, wherein the central gradient winding region is at a different radius than the main magnet system while the outer gradient winding regions are at about the same radius as the main magnet system.

11. The magnetic resonance scanner as set forth in claim 10, wherein the outer gradient winding regions are at a radius that is within about ±5% of the radius of the main magnet system.

12. The magnetic resonance scanner as set forth in claim 7, wherein the central gradient winding region is at a larger radius than the main magnet system while the outer gradient winding regions are at about the same radius as the main magnet system.

13. The magnetic resonance scanner as set forth in claim 7, wherein windings of the main magnet system and the longitudinal magnetic field gradient system are superconducting windings, and the scanner further includes:

a vacuum jacket containing the superconducting windings of the main magnet system and the longitudinal magnetic field gradient system.

14. The magnetic resonance scanner as set forth in claim 7, further comprising:

a transverse magnetic field gradient system wound to generate transversely directed magnetic field gradients at least in the scanning region.

15. The magnetic resonance scanner as set forth in claim 14, wherein the transverse magnetic field gradient system is disposed at a larger radius than the main magnet system.

* * * * *